(12) United States Patent
Rhodes (10) Patent No.: US 7,781,718 B2
(45) Date of Patent: Aug. 24, 2010

(54) GLOBALLY RESET IMAGE SENSOR PIXELS

(75) Inventor: Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/130,819

(22) Filed: May 30, 2008

(65) Prior Publication Data
US 2009/0294632 A1 Dec. 3, 2009

(51) Int. Cl.
*H01L 27/00* (2006.01)
*H04N 3/14* (2006.01)

(52) U.S. Cl. ..................... 250/208.1; 348/308

(58) Field of Classification Search ........... 250/208.1; 348/241, 308, 302
See application file for complete search history.

(56) References Cited

U.S. PATENT DOCUMENTS

| | | | |
|---|---|---|---|
| 6,414,342 B1 | 7/2002 | Rhodes | |
| 6,760,070 B1 * | 7/2004 | Merrill et al. | ............... 348/294 |
| 7,075,049 B2 | 7/2006 | Rhodes et al. | |
| 7,129,979 B1 | 10/2006 | Lee | |
| 7,214,575 B2 | 5/2007 | Rhodes | |
| 7,271,835 B2 | 9/2007 | Iizuka et al. | |
| 2005/0110093 A1 | 5/2005 | Altice et al. | |
| 2005/0266597 A1 | 12/2005 | Rhodes | |
| 2006/0044437 A1 * | 3/2006 | Shah | ............... 348/308 |
| 2006/0138486 A1 | 6/2006 | Lim | |
| 2007/0152292 A1 | 7/2007 | Toros et al. | |
| 2007/0285545 A1 * | 12/2007 | Hsieh | ............... 348/294 |

FOREIGN PATENT DOCUMENTS

| | | |
|---|---|---|
| EP | 1 117 250 A2 | 7/2001 |
| WO | WO 2006/011933 | 11/2006 |
| WO | WO 2007/024561 A1 | 3/2007 |

OTHER PUBLICATIONS

PCT/US2009/043665, PCT International Search Report and Written Opinion of the Searching Authority mailed Oct. 30, 2009, 10 pages.

* cited by examiner

*Primary Examiner*—Thanh X Luu
(74) *Attorney, Agent, or Firm*—Blakely Sokoloff Taylor & Zafman LLP (57) ABSTRACT

An imaging circuit includes a pixel array that is arranged to concurrently reset pixels in a pixel array in response to a global reset signal. The pixels are arranged in rows, such that the rows can be individually selected by a row select line. A reset transistor concurrently resets the pixels by coupling a reset voltage to a floating diffusion of the pixel. A transfer gate transistor selectively couples the floating diffusion to a storage region. A storage gate transistor selectively couples the storage region to a photosensitive region so that the reset transistor, the transfer gate transistor, and the storage gate transistor for each of the pixels can be activated in response to the global reset signal. A double correlated sampler may be used to provide a correlated double sample using a first sampled voltage of a reset voltage and a second sampled voltage of a pixel voltage that is produced when a photodiode region is exposed to incident light.

16 Claims, 9 Drawing Sheets

GLOBALLY RESET IMAGE SENSOR PIXELS

This disclosure relates generally to integrated circuits, and more particularly, but not exclusively, relates to integrated circuits for imaging.

BACKGROUND INFORMATION

Integrated circuits have been developed to reduce the size of components used to implement circuitry. For example, integrated circuits have been using ever-smaller design features, which reduces the area used to implement the circuitry, such that design features are now well under the wavelengths of visible light. With the ever-decreasing sizes of image sensors and the individual pixels that are part of a sensing array, it is important to more efficiently capture incident light that illuminates the sensing array. Thus, more efficiently capturing incident light helps to maintain or improve the quality of electronic images captured by the sensing arrays of ever-decreasing sizes. The quality of an electronic image can be improved, for example, by reducing image lag and by decreasing the image sensor latency. Image lag is charge in a photodiode region of a pixel that is leftover from exposure to a previous image. Image sensor latency can be the amount of time that is required by an image sensor to initialize itself and capture an image.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

DETAILED DESCRIPTION

Embodiments of a globally reset image sensor pixels are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

In general, integrated circuits comprise circuitry that is employed for a variety of applications. The applications use a wide variety of devices such as logic devices, imagers (including CMOS and CCD imagers), and memory (such as DRAM and NOR- and NAND-based flash memory devices). These devices normally employ transistors for a variety of functions, including switching and amplification of signals.

Transistors are typically formed in integrated circuits by photolithographic processes that are performed on a silicon substrate. The processes include steps such as applying a photographic resist layer to the substrate, exposing the resist layer to a pattern using light (including deep ultra-violet wavelengths), removing the exposed portions (or non-exposed portions) of the photoresist by etching, and modifying the exposed structure, for example, by depositing or implanting additional materials to form various structure for electronic components (including transistors).

The term "substrate" includes substrates formed using semiconductors based upon silicon, silicon-germanium, germanium, gallium arsenide, and the like. The term substrate may also refer to previous process steps that have been performed upon the substrate to form regions and/or junctions in the substrate. The term substrate can also include various technologies, such as doped and undoped semiconductors, epitaxial layers of silicon, and other semiconductor structures formed upon of the substrate.

Chemical-mechanical planarization (CMP) can be performed to render the surface of the modified substrate suitable for forming additional structures. The additional structures can be added to the substrate by performing additional processing steps, such as those listed above.

An imaging circuit is disclosed herein that includes a pixel array that is arranged to concurrently reset pixels in a pixel array in response to a global reset signal. The pixels are arranged in rows, such that the rows can be individually selected by a row select line. A reset transistor concurrently resets the pixels by coupling a reset voltage to a floating diffusion of the pixel. A transfer gate transistor selectively couples the floating diffusion to a storage region. A storage gate transistor selectively couples the storage region to a photosensitive region so that the reset transistor, the transfer gate transistor, and the storage gate transistor for each of the pixels are activated in response to the global reset signal. A double correlated sampler may be used to provide a correlated double sample using a first sampled voltage of a reset voltage and a second sampled voltage of a pixel voltage that is produced when a photodiode region is exposed to incident light.

Figure 1:
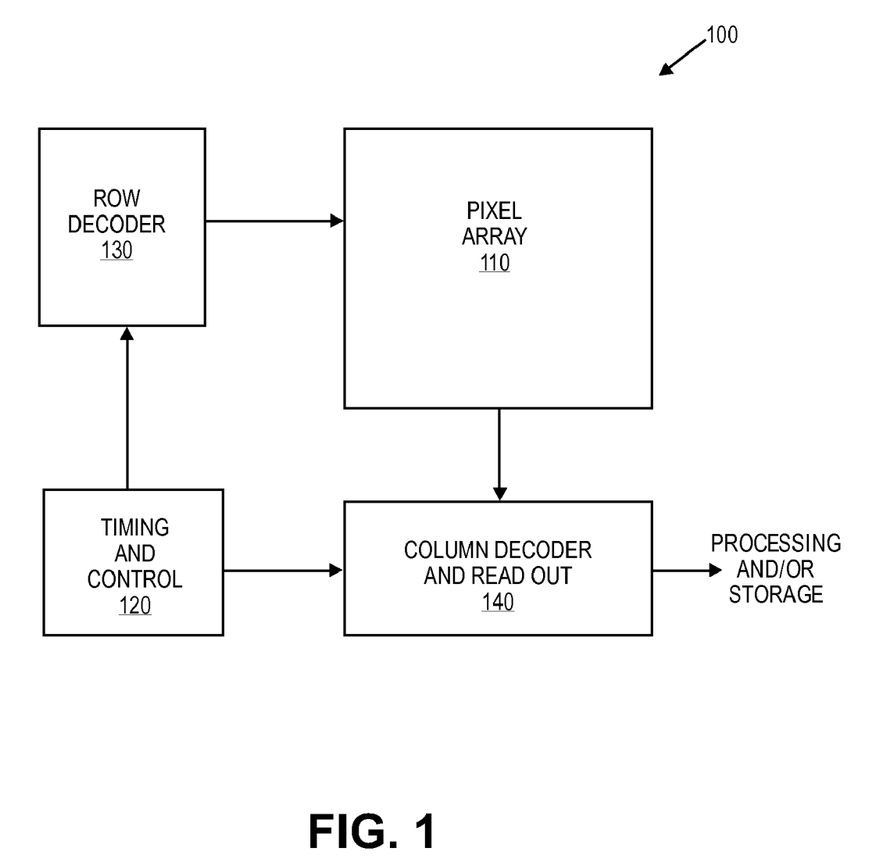
FIG. 1 illustrates a block diagram of a sample image sensor.

FIG. 1 illustrates a block diagram of a sample image sensor 100. Image sensor 100 includes pixel array 110, timing and control block 120, row decoder 130, and column decoder and readout block 140. In the example, pixel array 110 includes a plurality of pixels arranged in a predetermined number of columns and rows. Each row of pixels can be selected by row decoder 130. Each column can be selected and/or read by column decoder and readout block 140. Accordingly, individual pixels can by selected by using both the row decoder 130 and the column decoder and readout block 140 to address a desired pixel. Timing and control block 120 is typically arranged to control both the row decoder 130 and the column decoder and readout block 140.

Figure 2:
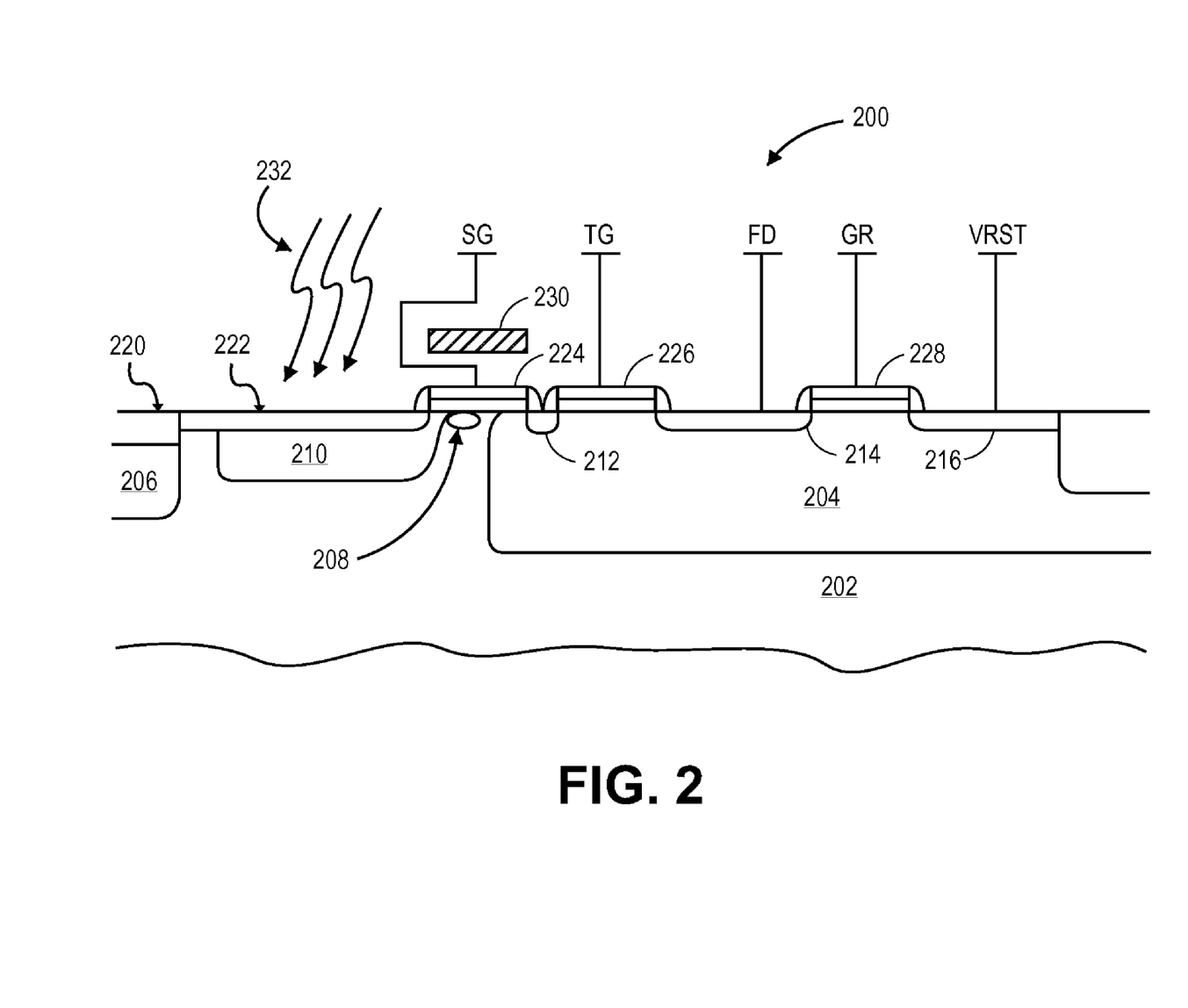
FIG. 2 is an illustration of a cross-section of a sample "one-shared" pixel structure having a barrier implant that is implemented in a pixel array.

FIG. 2 is an illustration of a cross-section of a sample "one-shared" pixel structure having a barrier implant that is implemented in a pixel array. Structure 200 includes a substrate 202 in which P-well structures 204 and 206 are formed. Photodiode region 210 is implanted and/or diffused in substrate 202. Photodiode region 210 can be hydrogenated amorphous silicon formed on the substrate 202. N-type regions 212, 214, and 216 are formed in P-well 204. A pinning layer 222 can be formed above region 210 which helps to confine photoelectrons to the region 210 until readout time. Region 208 may be a doped P-type or a lightly doped N-type.

Insulating structure 220 is formed above P-well structure 206. Insulating structures 220 can be formed using processes such as shallow trench isolation (STI) or local oxidation of silicon (LOCOS). An insulating structure 220 using an STI process can be formed by etching a void within P-well structure 206 and depositing a dielectric material (such as silicon dioxide) within the void. The deposited dielectric material can be planarized using CMP.

A storage gate transistor has a gate 224 in an area that is above and between regions 210 and 212. The storage gate (SG) transistor is controlled by signal SG (as discussed more fully with respect to FIG. 6). The storage gate transistor controls flow of electrons from the photodiode region 210 to the storage gate 224 when the captured charge is transferred to the storage gate. The storage gate transistor also controls flow of electrons from the storage gate 224 to the floating diffusion 214 when the transfer gate is turned on. The primary charge storage region is the storage gate 224.

A barrier implant 208 is formed in a region beneath storage gate 224 in substrate 202. The barrier implant can be formed using a P-type implant. Barrier implant 208 helps reduce image lag by helping to prevent charge that flows through the channel formed beneath the storage gate 224 (when gate 224 is activated) from flowing backwards into region 210.

Photoshield 230 is provided, for example, above storage gate 224 to help define an edge of an aperture through which photons 232 can be captured. Photoshield 230 also helps to prevent photons 232 from adversely affecting the stored electrical charge of the pixel after integration (the operation of the pixel is discussed more fully below with reference to FIG. 6). The photoshield 230 structure can be formed by depositing a metal layer or silicides over the storage gate 224.

A transfer gate transistor is formed using regions 212 and region 214 by forming the gate 226 in a region that is above and between regions 212 and 214. The transfer gate (TG) transistor is controlled by signal TG (as discussed more fully with respect to FIG. 6). The transfer gate transistor controls flow of electrons from the storage gate 224 to the floating diffusion region 214 when the captured charge is being transferred for readout. The transfer gate transistor also controls flow of electrons from the floating diffusion region 214 to the photodiode region 210 when both the storage gate and the transfer gate are turned on.

A global reset transistor is formed using region 216 and region 214 by forming the global reset gate 228 in a region that is above and between regions 216 and 214. The global reset (GR) transistor is controlled by signal GR (as discussed more fully with respect to FIG. 6). The global reset transistor controls flow of electrons from the reset voltage (VRST) region 216 to floating diffusion (FD) region 214 when the pixel is being (globally) reset. If the storage gate 224 and the transfer gate are also turned on, the global reset transistor will reset the photodiode region 210. The global reset transistor also can be used to implement a row reset of the FD as part of the readout of pixels within rows.

Figure 3:
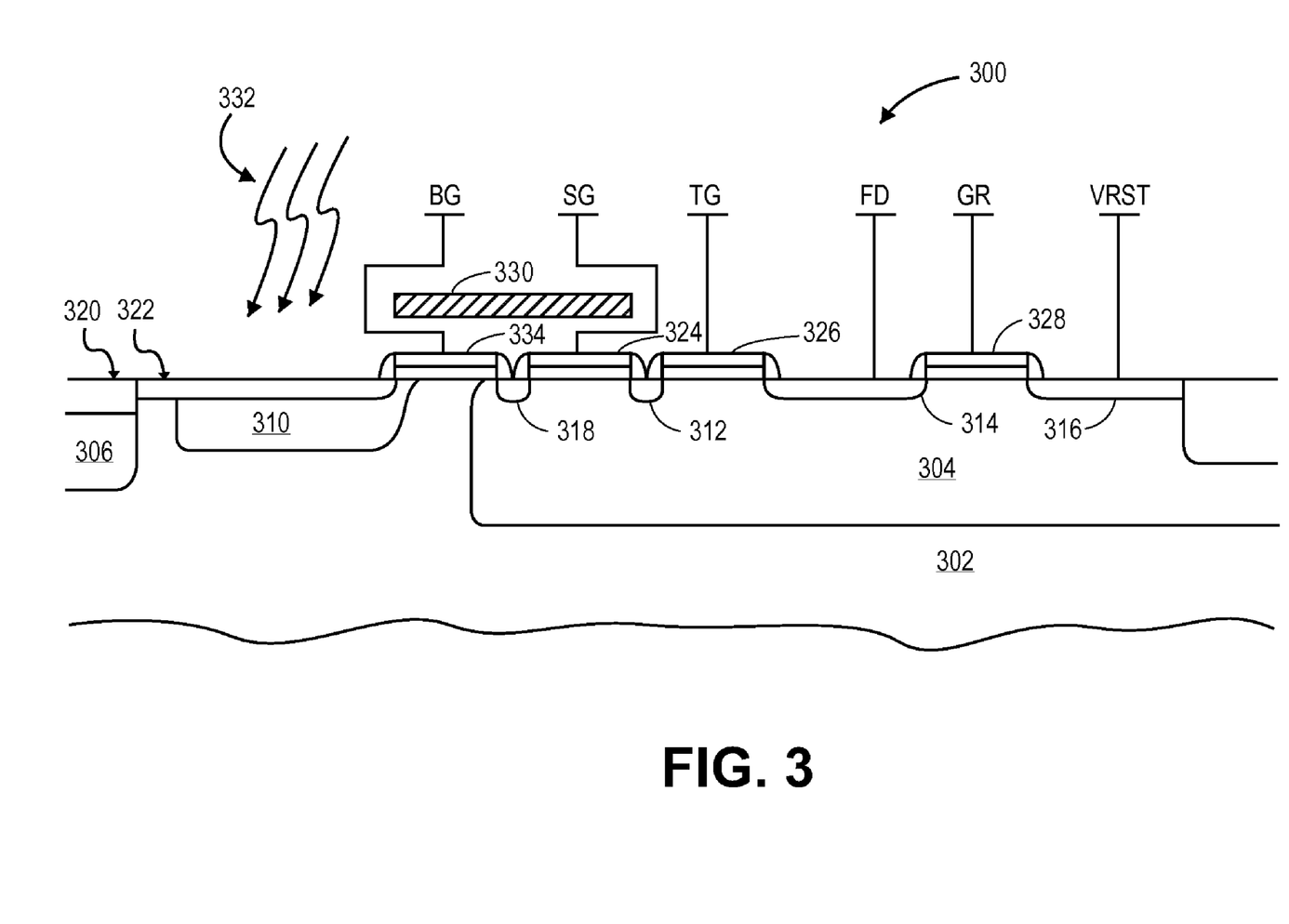
FIG. 3 is an illustration of a cross-section of a sample "one-shared" pixel structure having a barrier gate transistor that is implemented in a pixel array.

FIG. 3 is an illustration of a cross-section of a sample "one-shared" pixel structure having a barrier gate transistor that is implemented in a pixel array. Structure 300 includes a substrate 302 in which P-well structures 304 and 306 are formed. Photodiode region 310 is implanted and/or diffused in substrate 302. N-type regions 312, 314, and 316 are formed in P-well 304. A pinning layer 322 can be formed above region 310 which helps to confine photoelectrons to the region 310 until readout time.

Insulating structure 320 is formed above P-well structure 306. Insulating structures 320 can be formed using processes such as shallow trench isolation (STI) or local oxidation of silicon (LOCOS). An insulating structure 320 using an STI process can be formed by etching a trench within P-well structure 306 and depositing a dielectric material (such as silicon dioxide) within the trench. The deposited dielectric material can be planarized using CMP.

A barrier gate transistor is formed using regions 310 and region 318 by forming the transistor gate 334 in an area that is above and between regions 310 and 318. The barrier gate (BG) transistor is controlled by signal BG (as discussed more fully with respect to FIG. 6). The barrier gate transistor controls flow of electrons from the photodiode region 310 to region 318. The barrier transistor helps reduce image lag by operating in conjunction with the storage gate transistor (discussed below) helping to prevent charge that flows through the channel formed beneath the storage gate 324 (when gate 324 is activated) from flowing backwards into region 310.

A storage gate transistor is formed using regions 318 and region 312 by forming the transistor gate 324 in an area that is above and between regions 318 and 312. The storage gate (SG) transistor is controlled by signal SG (as discussed more fully with respect to FIG. 6). The storage gate transistor controls flow of electrons from the photodiode region 318 to region 312.

Photoshield 330 is provided, for example, above storage gate 324 and barrier gate 334 to help define an edge of an aperture through which photons 332 can be captured. Photoshield 330 also helps to prevent photons 332 from affecting the stored electrical charge of the pixel after integration (the operation of the pixel is discussed more fully below with reference to FIG. 6).

A transfer gate transistor is formed using regions 312 and region 314 by forming the transfer transistor gate 326 in a region that is above and between regions 312 and 314. The transfer gate (TG) transistor is controlled by signal TG (as discussed more fully with respect to FIG. 6). The transfer gate transistor controls flow of electrons from the (storage) region 312 to (floating diffusion) region 314 when the captured charged is being transferred for later measurement. The transfer gate transistor also controls flow of electrons from the floating diffusion region 314 to region 312 when the pixel is being (globally) reset.

A global reset transistor is formed using region 316 and region 314 by forming the global reset gate 328 in a region that is above and between regions 316 and 314. The global reset (GR) transistor is controlled by signal GR (as discussed more fully with respect to FIG. 6). The global reset transistor controls flow of electrons from the reset voltage (VRST) region 316 to floating diffusion (FD) region 314 when the pixel is being (globally) reset.

Figure 4:
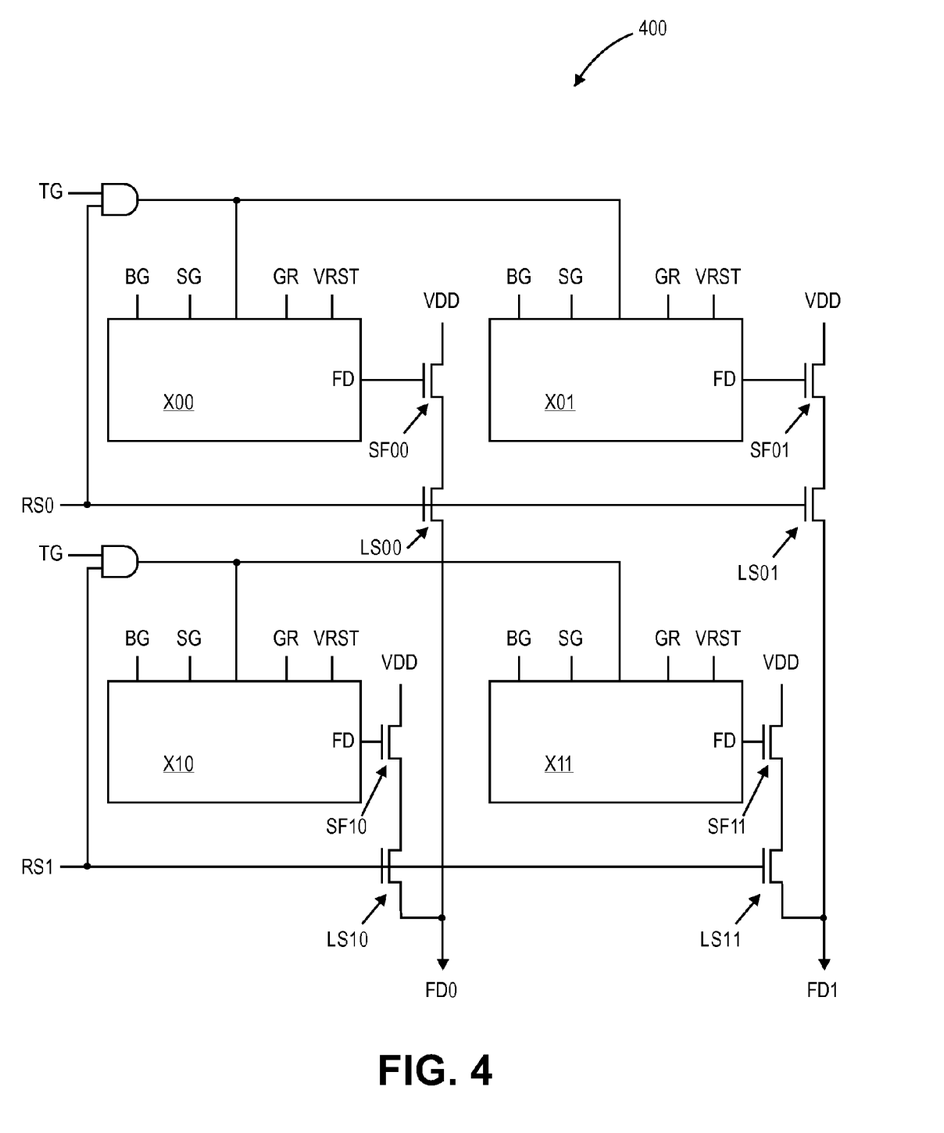
FIG. 4 illustrates a block diagram of a sample pixel array.

FIG. 4 illustrates a block diagram of a sample pixel array 400. Pixel array 400 is illustrated for simplicity as having four pixels arranged in two rows and columns. In practice, pixels arrays often have millions of pixels. Pixel array 400 comprises pixels X00, X01, X10, and X11, each of which can be similar to a pixel described above with reference to FIG. 3.

In operation, the charge of each pixel (pixel value) is readout by measuring the signal present on floating diffusion (FD) node of each pixel. (The setup, which includes a global reset, of each pixel is described below with reference to FIG. 6.) To read each pixel individually, a row-select line (such as RS0 or RS1) for each row of pixels is asserted, which activates the pixels in the selected row. (In the example, each row-select line is asserted at a different time from row-select lines of other rows.)

When the transfer gate (TG) signal is asserted, charge from the storage gate is transferred to the floating diffusion node. As shown in FIG. 4, the transfer gate for each pixel is not activated unless the row-select line for the row containing the pixel is also asserted. Thus only pixels within a selected row are readout.

The floating diffusion node is coupled to the gate of a transistor that is arranged as a source-follower (for example, transistors SF00, SF01, SF10, and SF11). As shown in the illustrated example, each source-follower transistor is coupled to a respective floating diffusion to amplify the voltage at the floating diffusion. The source of the source-follower transistor is coupled to VDD. (The VDD coupled to the source-followers can be, for example, switched on only when reading the pixels values). The drain of the source-follower is coupled to a line select transistor (for example, transistors LS00, LS01, LS10, and LS11) that is activated by a row-select line such that readings are made from pixels with a selected row. The pixel value for each column can be measured by using double correlated sampling (of signals FD0 and FD1, for example) as discussed below with reference to FIG. 5.

Figure 5:
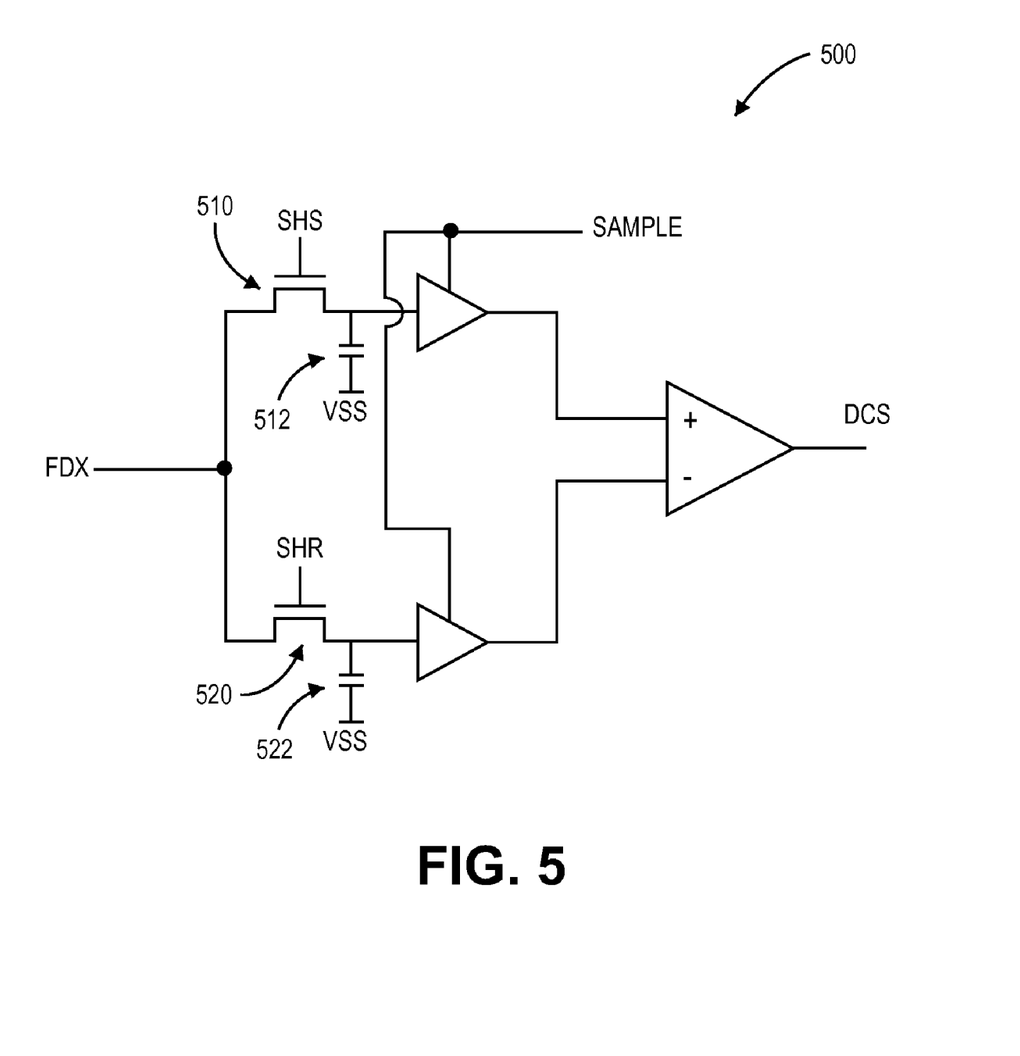
FIG. 5 is a schematic diagram illustrating a sample double correlated sampler.

FIG. 5 is a schematic diagram illustrating a sample double correlated sampler. Sampler 500 is suitable for double correlated sampling of pixel values from a pixel array. In an embodiment, one sampler is provided for each column of the pixel array. In principle, sampler 500 operates by measuring the value of a fully charged pixel, measuring the value of an exposed pixel, and producing a value that is a difference of the two measurements.

For example, all pixels within a pixel array can be in a fully charged state following a global reset. A fully charged (e.g. reset) pixel can be sampled by selecting a row that contains the pixel (as described above with reference to FIG. 4), and asserting the SHR (sample-hold reset) line to activate transistor 520 such that the charge can be stored in capacitor 522. The value of an exposed pixel can be sampled by selecting a row that contains the pixel, transferring charge from a photosensitive portion of the pixel to be floating diffusion node, asserting the SHS (sample-hold sample) line to activate transistor 510 such that the charge can be stored in capacitor 512. Asserting the SAMPLE signal provides the two measurements to the inputs of the comparator to generate a signal for the difference (signal DCS) of the charges stored in capacitors 512 and 522. Signal DCS is thus a correlated double sample of the pixel values sampled.

Figure 6:
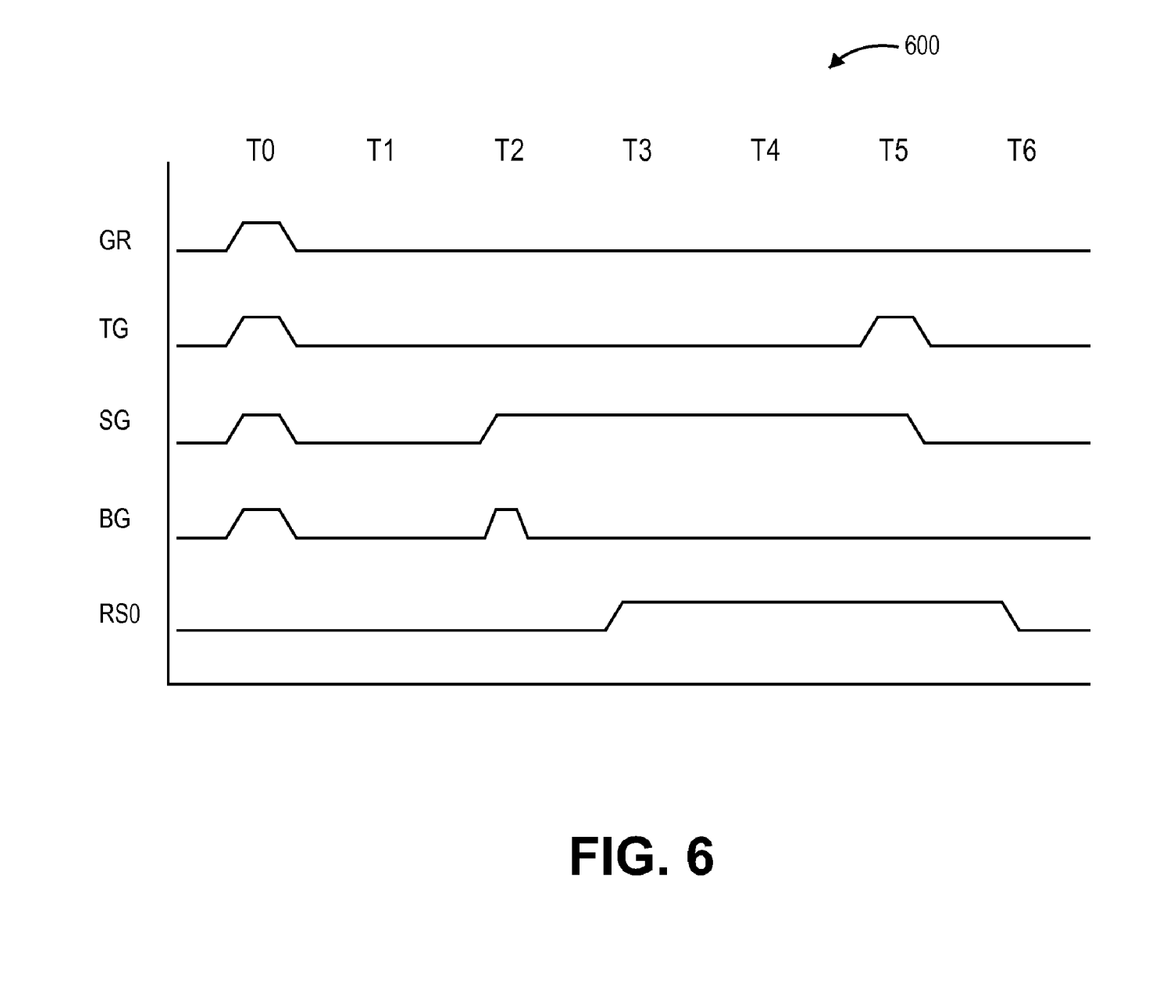
FIG. 6 is a timing diagram illustrating operation of a sample globally reset pixel array.

FIG. 6 is a timing diagram illustrating operation of a sample globally reset pixel array. Timing diagram 600 illustrates, for example, the operation of the pixel such as illustrated in FIGS. 3 and 4, and the operation of a correlated double sampler such as illustrated in FIG. 5. At time T0, signals GR (global reset), TG (transfer gate), SG (storage gate), BG (barrier gate) are asserted. In some embodiments, all row-select lines are simultaneously asserted during a global reset time to reset all pixels at the same time. In some embodiments, the SG transistor and the TG transistor are activated in response to the GR signal.

With reference to FIG. 3, transistor gates 334, 324, 326, and 328 are all simultaneously activated. In response, signal VRST (reset voltage) propagates from node 316 across the N-channel formed under the gate 328 such that region 314 (floating diffusion) is charged to the VRST voltage (less the threshold voltage of gate 328), or to $V_{pin}$ if the photodiode is fully depleted. With gates 326 324, and 334 being activated, region 310 (a photosensitive region of the pixel photodiode) is pre-charged to the VRST voltage (less the threshold voltage of the intervening gates). In the case that the photodiode is a fully depletable pinned photodiode, the photodiode is reset to $V_{pin}$ so long as $V_{pin} < VRST - V_{threshold}$. Accordingly, the pixels within the pixel array can be concurrently reset in accordance with the disclosed global reset.

With reference to FIG. 6, we describe an exemplary timing diagram. It is understood that there are other possible diagrams. In FIG. 6, each pixel in the pixel array undergoes an integration period at time T1. During the integration period, the photosensitive portion (region 310) of the pixel photodiode is exposed to incident light 332, which causes electron-hole pairs (charge) to be created and accumulated. The integration period ends at time T2, where barrier gate and storage gate are activated. Activation of the barrier gate and storage gate allows the cumulative charge to be transferred from the photodiode to the storage gate. As shown in the Figure, the barrier gate is deactivated before the storage gate is deactivated to help prevent backflow of the accumulated charge from the storage gate back to the photodiode. (The transfer gate is not activated at this time, which prevents flow of the charge to the floating diffusion region, which substantially maintains its pre-charged level.) The charge transferred to the storage gate is stored there while the storage gate is on.

At time T3, a row-select line is asserted that prepares all pixels within the row of a pixel array to be measured. Using FIG. 4 as an example, asserting row-select line RS0 prepares pixels X00 and X01 to be measured. At this time the floating diffusion regions of pixels X00 and X01 are presented to source-follower transistors SF00 and SF01, respectively. The source-follower transistors SF00 and SF01 drive lines FD0 and FD01 (respectively) because line select transistors LS00 and LS01 are activated by rows select line RS0.

At time T4, the floating diffusion voltage (as buffered by the source-followers) is measured. Using FIG. 5 as an example, signal FDX conveys the buffered floating diffusion voltage (such as signal FD0 or FD1 produced by a source-follower in FIG. 4). When signal SHR is pulsed, the signal FDX (conveying the pre-charged value) is sampled and held in capacitor 522.

At time T5, the transfer gate is turned on, allowing charge to be transferred from the storage gate to the floating diffusion. The storage gate is actively turned off to help by forcing charge out of the storage gate. Because the BG is off, the charge in the storage gate is forced to transfer to the floating diffusion. Using FIGS. 3 and 4 as examples, signal TG of FIG. 3 is activated because the row-select line RS0 is activated (as illustrated by the AND gate of pixel X00 in FIG. 4, for example). Thus the accumulated charge from integration (the exposure value) is transferred to the floating diffusion.

At time T6, the floating diffusion voltage (as buffered by the source-followers) is measured. Using FIG. 5 as an example, signal FDX conveys the buffered voltage from a source-follower in FIG. 4. When signal SHS is pulsed, the signal FDX (conveying the exposure value) is sampled and held in capacitor 512. Correlated double sampling can be achieved by activating signal SAMPLE (such as in FIG. 5), such that the difference in the sampled values (for pixels within a selected row) can be determined. Correlated double sampling reduces fixed pattern noise associated with process variations of each pixel among pixels in the pixel array. At the end of time T6, row-select line RS0 is deactivated. Thus, in this manner, charge can be read out in a row-by-row manner.

Figure 7:
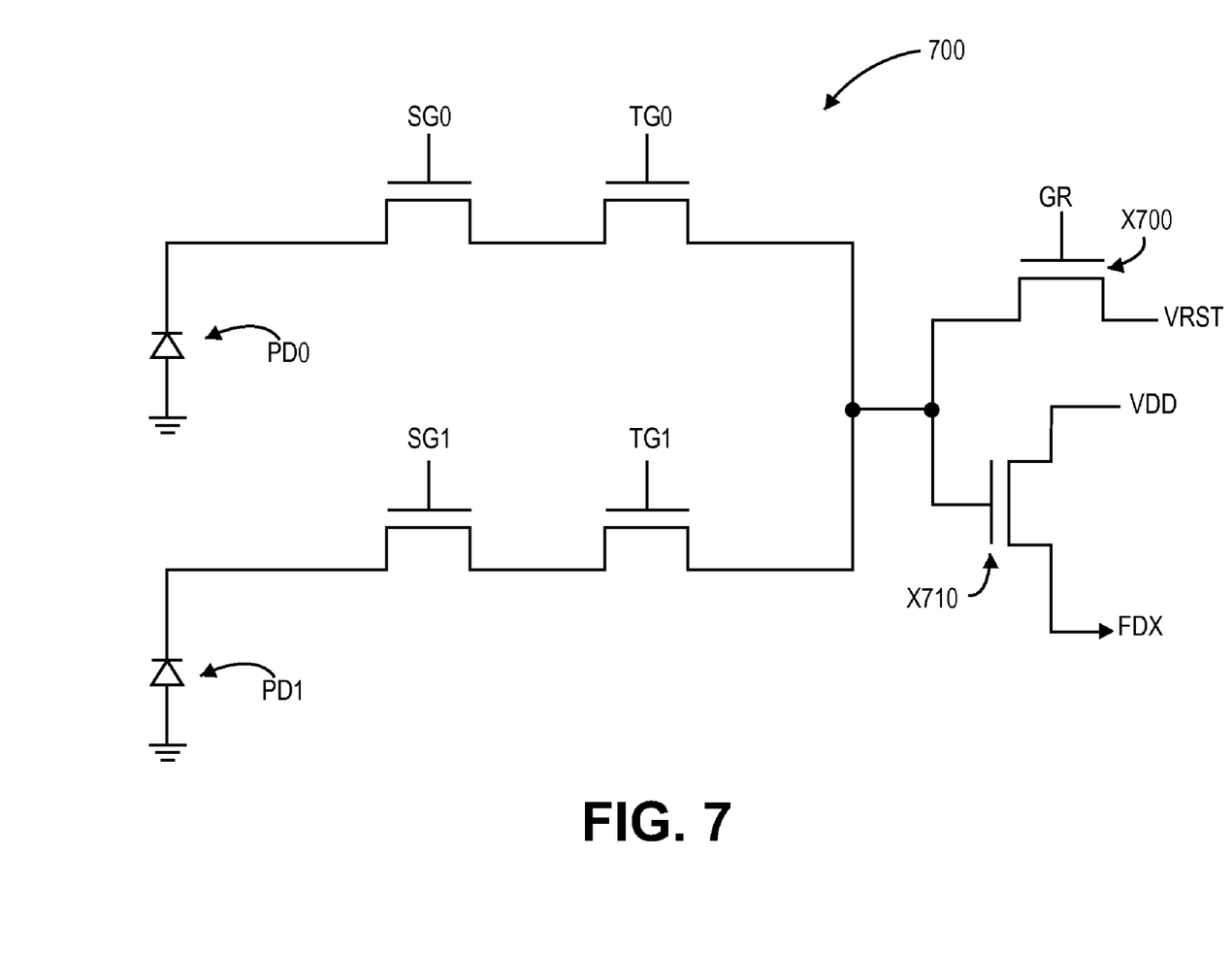
FIG. 7 is a schematic diagram of a sample "two-shared" pixel of a pixel array.

FIG. 7 is a schematic diagram of a sample "two-shared" pixel of a pixel array. To maximize light sensitivity, two adjacent pixels can share transistors that are used to readout a pixel (thus reducing the overall transistor count for non-light sensitive components of the pixel). For example, shared pixel circuit 700 includes two photodiodes (PD0 and PD1) that share common readout circuitry. Pixel PD0 is individually controlled by transistors having gates coupled to signals SG0 (storage gate 0) and TG0 (transfer gate 0). Pixel PD1 is individually controlled by transistors having gates coupled to signals SG1 (storage gate 1) and TG1 (transfer gate 1). As understood by reference to the preceding explanation, pixel PD0 and pixel PD1 can be read both be read (albeit at different times) via source-follower X710 by asserting the transfer gate signals at different times. However, applying a global reset (GR) signal to transistor X700 and activating the storage date and transfer gate signals at the same time allows all shared pixels (and all pixels of the array) to be globally reset at the same time.

Figure 8:
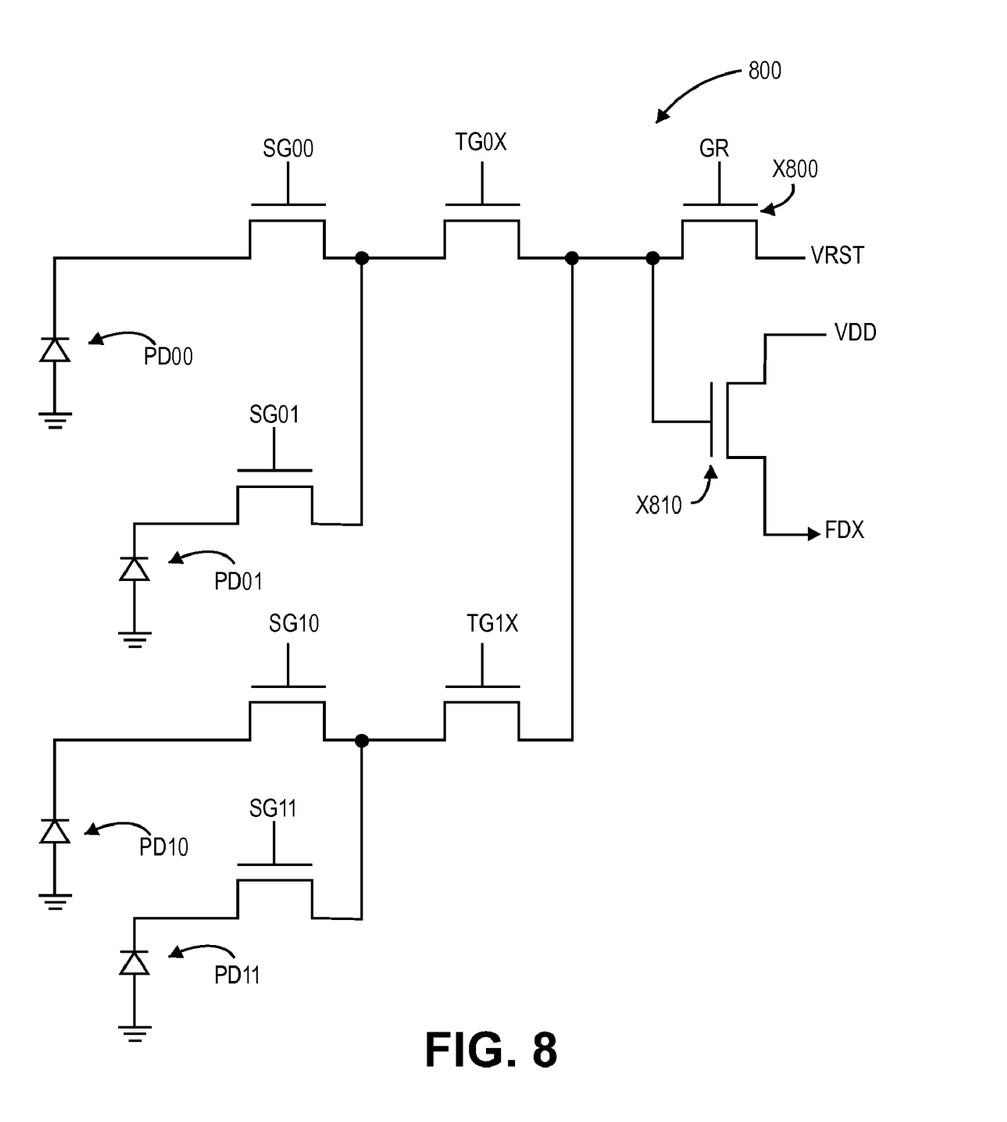
FIG. 8 is a schematic diagram of a sample "four-shared" pixel of a pixel array.

FIG. 8 is a schematic diagram of a sample "four-shared" pixel of a pixel array. To even further maximize light sensitivity, four neighboring pixels can share transistors that are used to readout a pixel (thus even further reducing the overall transistor count for non-light sensitive components of the pixel). For example, shared pixel circuit 800 comprises four photodiodes (PD00, PD01, PD10, and PD11) that share common readout circuitry. Each pixel is individually controlled by respective storage gate signal (SG00, SG01, SG10, and SG11). Signals SG00 and SG01 are activated at separate times during readout to transfer charge to the source of the transistor controlled by TG0X. Signals SG10 and SG11 are activated at separate times during readout to transfer charge to the source of the transistor controlled by TG1X. Signals TG0X and TG1X activated at separate times during readout to transfer charge to the gate of source-follower X810 such that the shared pixels can each be individually readout. The four shared pixels can be simultaneously reset by applying a global reset (GR) signal to transistor X800 and activating the storage date and transfer gate signals at the same time.

Figure 9:
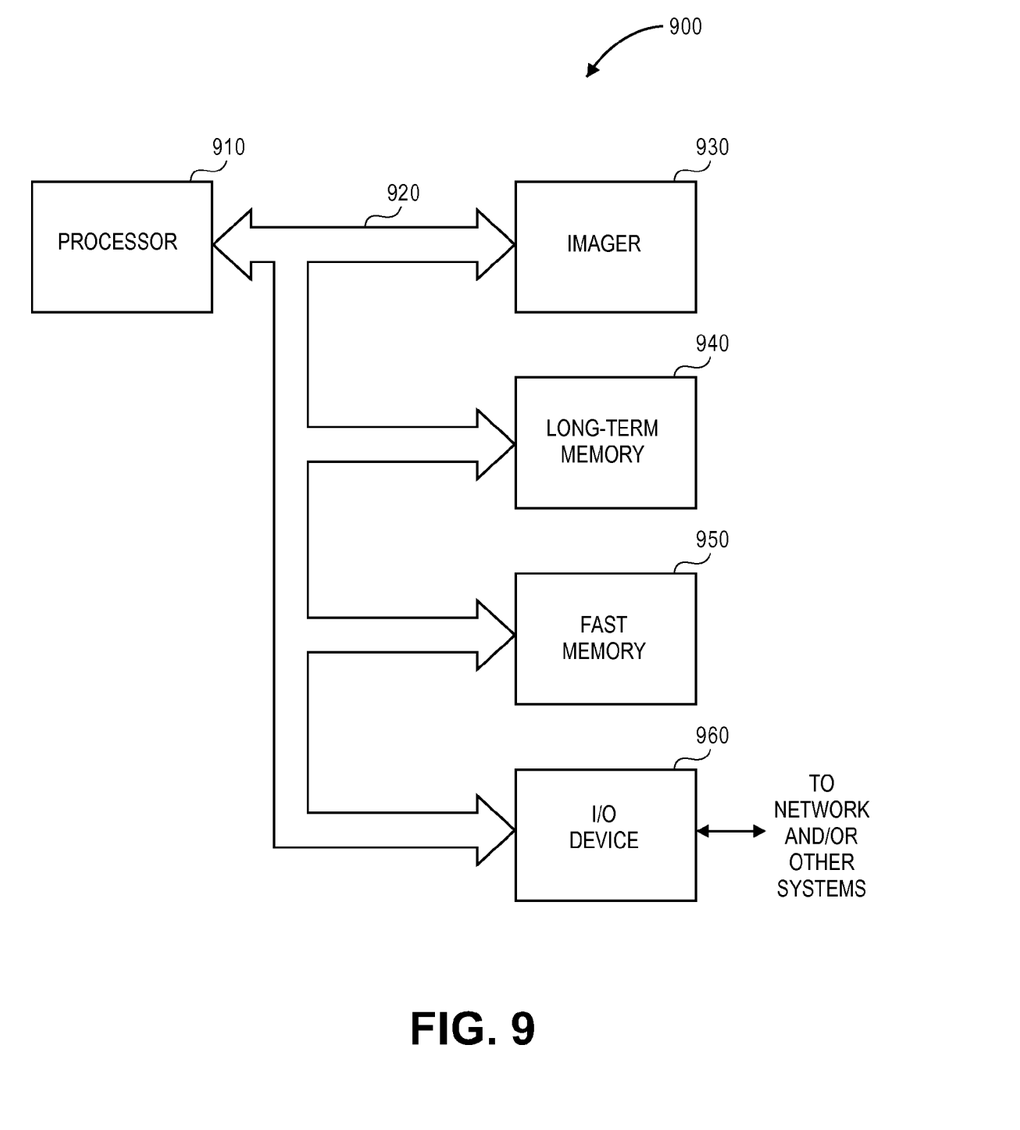
FIG. 9 illustrates a sample system that includes an image sensor with a global reset.

FIG. 9 illustrates a sample system that includes a image sensor with a global reset. System 900 generally includes digital and/or analog circuits such as logic devices, CMOS imagers, CCD integers, and memory (including dram and NOR and/or NAND flash memory).

Components of system 900 typically include a processor 910 that communicates with various devices using a bus 920. Transistors of processor 910 (that have a reduced gate contact area) can operate more quickly because the reduced gate capacitance allows the transistors to switch more quickly. The greater density of smaller transistors in logic circuits can be used to provide additional logic functions in a given substrate area for increased processing power.

The various devices may include imager 930, long-term memory 940, fast memory 950, and I/O device 960. Imager 930 may include CCD based or CMOS based photo transistors. The photo transistors are typically very densely packed as described above to allow higher resolution imaging.

Long-term memory devices 940 typically include nonvolatile memory such as magnetic media, PROMs, flash memory devices, compact discs, and the like. Long-term memory devices are typically non-volatile (e.g., do not lose information when properly turned off) but provide memory accesses that are slower than the fast memory 950 described below.

Fast memory 950 is typically based on SRAM or DRAM technology. The transistors of the memory cells of the SRAM or DRAM technology are typically volatile memory devices (e.g., they lose stored memory information when power is removed from a volatile memory device) but are typically smaller and faster than long-term memory devices described above.

I/O device 960 is typically used to allow communications between system 900 and other systems and/or sensors. I/O. device 960 can be a high speed serial interface in accordance with various networks. I/O device 960 typically sends and receives information to and from networks and systems that are on the networks.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising:
an array of pixels formed using a substrate, wherein each of the pixels in the array includes:
a photosensitive region formed in the substrate;
a storage gate transistor;
a barrier gate transistor coupled between the storage gate transistor and the photosensitive region;
a transfer gate transistor coupled to the storage gate;
a floating diffusion region coupled to transfer gate transistor;
an amplifier coupled to the floating diffusion region to amplify a voltage of the floating diffusion region; and
a global reset transistor that is coupled to the floating diffusion region, wherein the global reset transistor includes a gate that is coupled to receive a global reset signal to reset the pixel, wherein the barrier gate transistor, the transfer gate transistor and the storage gate transistor for each of the pixels are activated in response to the global reset signal while resetting the pixel.

2. The image sensor of claim 1, wherein the photosensitive region comprises a diode formed by an P-well in a N-type substrate.

3. The image sensor of claim 1, wherein the storage gate transistor, the transfer gate transistor, are coupled to be activated in response to the global reset signal.

4. The image sensor of claim 1, wherein the transfer gate transistor of a pixel in a row of pixels is coupled to be activated in response to an assertion of a row-select line for the row of pixels.

5. The image sensor of claim 1, wherein adjacent pairs of pixels in the pixel array are two-shared.

6. The image sensor of claim 1, wherein adjacent pairs of pixels in the pixel array are four-shared.

7. The image sensor of claim 1, further comprising a photoshield structure being disposed above a gate of the storage gate transistor to shield the gate of the storage gate transistor from incident light.

8. The image sensor of claim 7, wherein the photoshield structure comprises a conductive material.

9. A method, comprising:
resetting pixels in a pixel array concurrently in response to a global reset signal, wherein the pixels are concurrently reset by:
  activating a reset transistor to couple a reset voltage to a floating diffusion region of the pixel;
  activating a transfer gate transistor to couple the floating diffusion region to a storage region; and
  activating a storage gate transistor to couple the storage region to a photosensitive region through a barrier gate transistor coupled between the storage gate transistor and the photosensitive region, wherein the reset transistor, the transfer gate transistor, and the storage gate transistor for each of the pixels are activated at the same time;
generating a double correlated sample for exposing the photodiode region to incident light to generate an integration voltage;
sampling a first voltage of the floating diffusion region;
activating the storage gate transistor to couple the photosensitive region to the storage region;
activating the transfer gate transistor to couple the storage region to the floating diffusion region;
sampling a second voltage of the floating diffusion region; and
providing the correlated double sample using the first and second sampled voltages.

10. The method of claim 9, wherein the pixels are arranged in rows, wherein the rows are individually selected by a row select line.

11. The method of claim 9, wherein the first and second sampled voltages are provided to a comparator to generate the correlated double sample.

12. An electrical device, comprising:
a pixel array that is arranged to, in response to a global reset signal, concurrently reset pixels in different rows within the pixel array, wherein the pixel rows are individually selected for readout by a row select line; wherein each pixel comprises:
  a reset transistor for resetting the pixel in response to the global reset signal by coupling a reset voltage to a floating diffusion of the pixel;
  a transfer gate transistor for coupling the floating diffusion to a storage region;
  a storage gate transistor for coupling the storage region to a photosensitive region; and
  a barrier gate transistor coupled between the storage gate and the photosensitive region,
wherein the reset transistor, the barrier gate transistor, the transfer gate transistor, and the storage gate transistor for each of the pixels are activated at the same time in response to the global reset signal.

13. The apparatus of claim 12, further comprising a double correlated sampler for providing a correlated double sample using a first sampled voltage of a reset voltage and a second sampled voltage of a pixel voltage resulting from exposing the photodiode region to incident light.

14. The apparatus of claim 12, wherein the pixel array is further arranged to, in response to a global reset signal, concurrently reset pixels in different columns within the pixel array.

15. The apparatus of claim 12, further comprising a photoshield structure formed over the storage gate.

16. The apparatus of claim 12, wherein the reset transistor is further arranged to reset the floating diffusion of the pixel in response to the assertion of a row select line for the row the includes the pixel.

* * * * *